(12) United States Patent  
Kim et al.

(10) Patent No.: US 12,248,243 B2
(45) Date of Patent: Mar. 11, 2025

(54) MULTILAYER GRAPHENE DIRECT GROWTH METHOD AND METHOD FOR MANUFACTURING PELLICLE FOR EXTREME ULTRAVIOLET LITHOGRAPHY USING THE SAME

(71) Applicant: KOREA ELECTRONICS TECHNOLOGY INSTITUTE, Seongnam-si (KR)

(72) Inventors: Hyeong Keun Kim, Yongin-si (KR); Seul Gi Kim, Yongin-si (KR); Hyun Mi Kim, Seoul (KR); Hye Young Kim, Bucheon-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 527 days.

(21) Appl. No.: 17/454,377

(22) Filed: Nov. 10, 2021

(65) Prior Publication Data

US 2022/0146928 A1 May 12, 2022

(30) Foreign Application Priority Data

Nov. 11, 2020 (KR) .................. 10-2020-0149813

(51) Int. Cl.
  *G03F 1/64* (2012.01)
  *C01B 32/182* (2017.01)
  *G03F 7/00* (2006.01)

(52) U.S. Cl.
  CPC .............. *G03F 1/64* (2013.01); *C01B 32/182* (2017.08); *G03F 7/70983* (2013.01); *C01B 2204/04* (2013.01)

(58) Field of Classification Search
  CPC ............ G03F 1/62; G03F 1/64; C01B 32/182
  See application file for complete search history.

(56) References Cited

U.S. PATENT DOCUMENTS 11,392,049 B2 7/2022 Kim et al.
11,789,359 B2 * 10/2023 Kim ...................... C01B 32/186
  430/5

(Continued)

FOREIGN PATENT DOCUMENTS

CN 104477903 A 4/2015
JP 2006-170916 A 6/2006

(Continued)

OTHER PUBLICATIONS

Office Action in corresponding Japanese Application No. 2021-183857 dated Jan. 17, 2023.

(Continued)

*Primary Examiner* — Daborah Chacko-Davis
(74) *Attorney, Agent, or Firm* — Knobbe, Martens, Olson, & Bear, LLP

(57) ABSTRACT

This application relates to a method for direct growth of multilayer graphene used as a core layer of a pellicle for extreme ultraviolet lithography. This application also relates to a method for manufacturing the pellicle for extreme ultraviolet lithography by using the multilayer graphene direct growth method. The multilayer graphene direct growth method may include forming few-layer graphene on a silicon nitride substrate, forming a metal catalyst layer on the few-layer graphene, and forming an amorphous carbon layer on the metal catalyst layer. The method may also include directly growing multilayer graphene from the few-layer graphene used as a seed layer by interlayer exchange between the metal catalyst layer and the amorphous carbon layer through heat treatment.

15 Claims, 10 Drawing Sheets

(56) References Cited

U.S. PATENT DOCUMENTS

| | | |
|---|---|---|
| 2011/0206934 A1 | 8/2011 | Bol et al. |
| 2012/0267041 A1 | 10/2012 | Woo et al. |
| 2017/0205704 A1 | 7/2017 | Nikipelov et al. |
| 2019/0056654 A1 | 2/2019 | Peter et al. |
| 2019/0129299 A1 | 5/2019 | Nasalevich et al. |
| 2020/0406244 A1 | 12/2020 | Kurganova et al. |
| 2022/0326602 A1 | 10/2022 | Kim et al. |
| 2023/0125229 A1 | 4/2023 | Kim et al. |

FOREIGN PATENT DOCUMENTS

| | | |
|---|---|---|
| JP | 2018-035010 A | 3/2018 |
| JP | 2018-531426 A | 10/2018 |
| JP | 2020-098227 A | 6/2020 |
| KR | 1020170077207 | 7/2017 |
| KR | 10-2018-0072786 A | 6/2018 |
| KR | 10-18787330 B1 | 7/2018 |
| KR | 10-2018-0135490 A | 12/2018 |
| KR | 10-2019-0053706 A | 5/2019 |
| KR | 10-2020-0112756 A | 10/2020 |
| KR | 10-2020-0126216 A | 11/2020 |
| KR | 1020200130289 | 11/2020 |
| WO | WO 2017/102379 A1 | 6/2017 |
| WO | WO 2017/122975 A1 | 7/2017 |
| WO | WO 2017/186486 A1 | 11/2017 |
| WO | 2019-170356 A1 | 9/2019 |

OTHER PUBLICATIONS

Notice of Allowance in corresponding Europe Application No. 21207713.5 dated May 15, 2023.
Extended European Search Report in corresponding Europe Application No. 21207713.5 dated Apr. 7, 2022.
Rodríguez-Manzo et al. "Graphene growth by a metal-catalyzed solid-state transformation of amorphous carbon" ACS Nani, vol. 5 No. 2: (Feb. 22, 2011); pp. 1529-1534.
Extended European Search Report in European Application No. 21207122.9 dated Mar. 25, 2022 in 10 pages.
Notice of Allowance dated Apr. 6, 2022 in U.S. Appl. No. 17/454,104.
Office Action dated Aug. 16, 2023 in U.S. Appl. No. 17/456,839.
Notice of Allowance dated Nov. 15, 2023 in U.S. Appl. No. 17/456,839.
Office Action dated Apr. 21, 2021 in Korean Application No. 10-2020-0149813.
Notice of Allowance dated Jul. 19, 2021 in Korean Application No. 10-2020-0149813.
Office Action dated Apr. 22, 2021 in Korean Application No. 10-2020-0148420.
Weatherup, Robert S., et al. "Introducing carbon diffusion barriers for uniform, high-quality graphene growth from solid sources." Nano letters 13.10 (Sep. 11, 2013): 4624-4631.
Office Action in Korean Application No. 10-2021-0045887 dated Jan. 9, 2023 and English machine translation.
Notice of Allowance dated Jul. 14, 2023 in Korean Application No. 10-2021-0045887.

* cited by examiner

MULTILAYER GRAPHENE DIRECT GROWTH METHOD AND METHOD FOR MANUFACTURING PELLICLE FOR EXTREME ULTRAVIOLET LITHOGRAPHY USING THE SAME

CROSS-REFERENCE TO RELATED APPLICATION

The present application claims priority to Korean Patent Application No. 10-2020-0149813 filed on Nov. 11, 2020 in the Korean Intellectual Property Office, which is incorporated herein in its entirety by reference.

BACKGROUND

Technical Field

The present disclosure relates to a semiconductor lithography technology, and more particularly, to a method for direct growth of multilayer graphene used as a core layer of a pellicle for extreme ultraviolet lithography, and a method for manufacturing the pellicle for extreme ultraviolet lithography using the same.

Description of Related Technology

As the semiconductor industry continues to develop and the degree of semiconductor integration is dramatically improved, electronic devices are becoming smaller and lighter. In order to further improve the degree of semiconductor integration, the advancement of lithography technology is required.

Currently, technology is developing toward realizing a fine pattern of a semiconductor by reducing the wavelength of light. Extreme ultraviolet (EUV) lithography technology, recently developed as a next-generation technology, can realize a fine pattern through a single resist process.

An extreme ultraviolet lithography apparatus used in a semiconductor process includes a light source power, a resist, a pellicle, and a mask. The pellicle is installed on the mask to prevent contaminants generated during the lithography process from adhering to the mask, and is selectively used depending on the lithography machine.

In the extreme ultraviolet lithography process, there was an expectation that the pellicle would not be needed because a clean system was built. However, it has been known that during an actual operation after the construction of the lithography apparatus, contamination of the mask is caused by foreign substances generated from an internal driving unit of the apparatus, particles of tin generated in the oscillation of the light source, and extreme ultraviolet photoresist.

Therefore, in the extreme ultraviolet lithography process, the pellicle is recognized as an essential component so as to prevent contamination of the mask. When the pellicle is used, defects smaller than 10,000 nm in size are negligible.

The pellicle for extreme ultraviolet lithography is required to have a size of 110 mm×144 mm to cover the mask, and an extreme ultraviolet transmittance of 90% or more is required in order to minimize deterioration of productivity due to loss of a light source. In addition, mechanical stability that the pellicle is not damaged by physical movement up to 20 G inside the extreme ultraviolet lithography apparatus, and thermal stability that the pellicle can withstand a thermal load of 250 W or more based on a 5 nm node are required.

Also, chemical durability that the pellicle does not react to hydrogen radicals generated in an extreme ultraviolet environment is required.

SUMMARY

The present disclosure provides a method for direct growth of multilayer graphene used as a core layer of a pellicle for extreme ultraviolet lithography, thus simplifying a manufacturing process of the multilayer graphene.

In addition, the present disclosure provides a method for manufacturing the pellicle for extreme ultraviolet lithography by using the multilayer graphene direct growth method.

According to embodiments of the present disclosure, a method for direct growth of multilayer graphene used in a pellicle for extreme ultraviolet lithography may include forming few-layer graphene on a silicon nitride substrate; forming a metal catalyst layer on the few-layer graphene; forming an amorphous carbon layer on the metal catalyst layer; and directly growing multilayer graphene from the few-layer graphene used as a seed layer by interlayer exchange between the metal catalyst layer and the amorphous carbon layer through heat treatment, wherein carbon in the amorphous carbon layer passes through the metal catalyst layer and is moved to the few-layer graphene.

The silicon nitride substrate may be used for the pellicle for extreme ultraviolet lithography, and include a silicon substrate and a support layer made of a silicon nitride material and formed on the silicon substrate, and the few-layer graphene may be formed on the support layer.

The few-layer graphene may be graphene with five or less layers.

The few-layer graphene may be formed on the support layer by means of transferring technique.

The few-layer graphene may be a diffusion barrier for preventing metal of the metal catalyst layer from diffusing into the silicon nitride substrate.

A material of the metal catalyst layer may include Ni, Co, Ru, or Pt.

The metal catalyst layer may be formed to have a thickness of 10 nm to 100 nm by a sputtering process or an e-beam evaporation process.

The amorphous carbon layer may be formed to have a thickness of 10 nm to 100 nm by a sputtering process.

The heat treatment may be performed at 500 to 1100° C. for 10 minutes to 10 hours in a hydrogen gas and inert gas atmosphere, and the inert gas may include at least one of nitrogen, argon, and helium.

The method may further include, after directly growing the multilayer graphene, removing the metal catalyst layer on the multilayer graphene.

In addition, according to embodiments of the present disclosure, a method for manufacturing a pellicle for extreme ultraviolet lithography by using a direct growth of multilayer graphene may include forming a core layer by directly growing multilayer graphene on a silicon nitride substrate; forming a capping layer on the core layer; and forming an opening for partially exposing the core layer by removing a central portion of the silicon nitride substrate under the core layer, wherein forming the core layer may include forming few-layer graphene on the silicon nitride substrate; forming a metal catalyst layer on the few-layer graphene; forming an amorphous carbon layer on the metal catalyst layer; directly growing the multilayer graphene from the few-layer graphene used as a seed layer by interlayer exchange between the metal catalyst layer and the amorphous carbon layer through heat treatment, wherein carbon in the amorphous carbon layer passes through the metal catalyst layer and is moved to the few-layer graphene; and removing the metal catalyst layer on the multilayer graphene.

The silicon nitride substrate may include a silicon substrate and a support layer made of a silicon nitride material and formed on the silicon substrate, wherein the few-layer graphene may be formed on the support layer, and wherein the opening may be formed by removing a central portion of the silicon substrate under the support layer.

The few-layer graphene may be graphene with five or less layers, and is a diffusion barrier for preventing metal of the metal catalyst layer from diffusing into the silicon nitride substrate.

A material of the capping layer may include $SiN_x$, BN, $ZrB_x$ (2≤x<16), $ZrB_xSi_y$ (x≥2, y≥2), Si—BN, or Zr.

The capping layer may be formed on the core layer to have a thickness of 1 nm to 5 nm by an atomic layer deposition (ALD) process or an ion beam sputtering deposition (IBSD) process.

According to embodiments of the present disclosure, when heat treatment is performed using the few-layer graphene formed on the support layer of the silicon nitride substrate as a seed layer, the multilayer graphene is directly grown on the support layer by means of the interlayer exchange principle. That is, when the metal catalyst layer and the amorphous carbon layer are sequentially formed on the few-layer graphene and then subjected to heat treatment, carbon in the amorphous carbon layer is moved to the few-layer graphene by the interlayer exchange between the metal catalyst layer and the amorphous carbon layer to directly grow the multilayer graphene.

Thermodynamically, a driving force of the interlayer exchange is because the Gibbs free energy is lowered when the amorphous carbon becomes a crystalline state. Therefore, if the few-layer graphene acting as a seed layer is placed under the metal catalyst layer, the interlayer exchanges can occur wholly and smoothly even if the heat treatment is performed at a temperature lower than a conventional heat treatment temperature for growing the multilayer graphene.

Because the multilayer graphene can be directly grown on the support layer of the silicon nitride substrate, the manufacturing process of the multilayer graphene can be simplified in manufacturing the pellicle.

In addition, the pellicle for extreme ultraviolet exposure can be manufactured using the multilayer graphene directly grown on the support layer.

The pellicle manufactured by the manufacturing method of the present disclosure includes the multilayer graphene as the core layer, so it can provide thermal stability, mechanical stability, and chemical durability while having a high extreme ultraviolet transmittance of 90% or more.

Because the few-layer graphene functions as a diffusion barrier that prevents metal of the metal catalyst layer from diffusing into the support layer during the heat treatment process, the quality of the multilayer graphene directly grown on the support layer can be improved.

Even if the multilayer graphene manufactured by the manufacturing method of the present disclosure is employed as the core layer, and a silicon nitride layer of several nanometers is formed as the capping layer on the core layer, it is possible to provide an extreme ultraviolet transmittance of 90% or more and a maximum reflectance of 0.0005%.

In addition, by forming the capping layer in an atomic layer deposition (ALD) process or an ion beam sputtering deposition (IBSD) process, it is possible to realize the best transmittance and minimized defects through free control of thickness, physical properties, and chemical composition.

DETAILED DESCRIPTION

Figure 1:
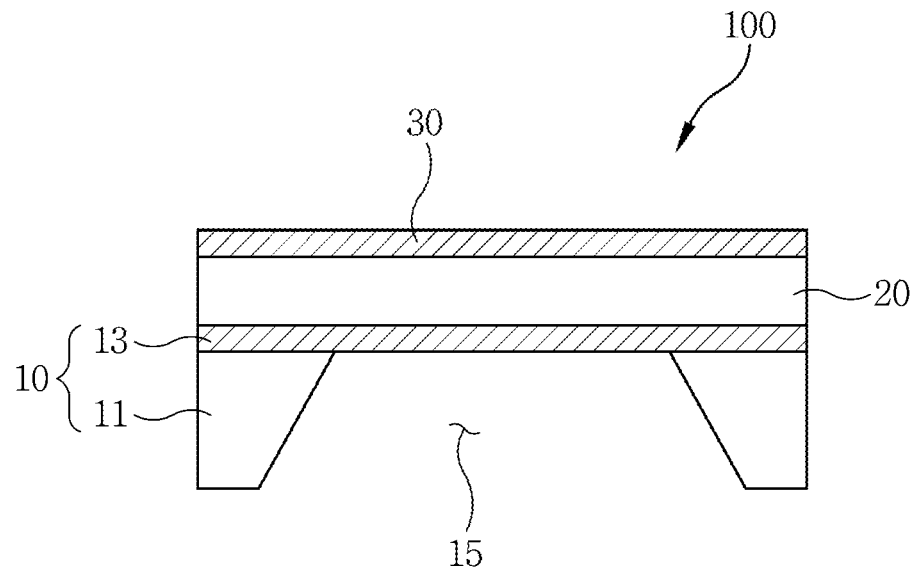
FIG. 1 is a cross-sectional view showing a pellicle for extreme ultraviolet lithography using directly grown multilayer graphene according to the present disclosure.

Currently, pellicle development companies are developing transmissive materials based on polycrystalline silicon (p-Si) or SiN. However, such materials do not satisfy a transmittance of 90% or more, which is the most important condition of a pellicle for extreme ultraviolet lithography. Also, such materials have weaknesses in thermal stability, mechanical stability, and chemical durability in an extreme ultraviolet lithography environment, so that process development research is being conducted to supplement their properties. For example, materials such as Mo, Ru, and Zr have been selected and studied as materials for solving the problems of SiN-based materials, but it is difficult to manufacture a thin film and maintain its shape.

In order to address the above-discussed issue, a graphene-based pellicle for extreme ultraviolet lithography has been introduced. Graphene has a transmittance of 90% or more for extreme ultraviolet rays. In addition, graphene has very high tensile strength when base planes are uniformly arranged in the areal direction, so it can satisfy all characteristic indicators such as high transmittance, thermal stability, and mechanical stability.

However, due to the complexity of a manufacturing process and the difficulty in quality control, graphene has not yet been implemented with a full-size membrane.

In a conventional method of manufacturing graphene for a pellicle, a nickel foil or a nickel thin film is placed in a vapor deposition apparatus and heat-treated in an atmosphere containing hydrogen and methane. Then, graphene is grown on the surface, and when nickel is etched using an aqueous iron chloride solution or the like, graphene of a separated thin film can be obtained.

Unfortunately, this method requires several steps, such as coating polymethyl methacrylate (PMAA) as a support layer and etching a metal catalyst, in a transfer process after graphene growth. In addition, there is a possibility that a free-standing graphene thin film may be broken during a process of immersion in acetone to remove PMMA and a process of metal catalyst etching, or wrinkling may occur in transferred to another substrate. Therefore, there is a limit to large-area realization and mass production.

Hereinafter, an embodiment of the present disclosure will be described in detail with reference to the accompanying drawings. The present disclosure may, however, be embodied in many different forms and should not be construed as being limited to the embodiment set forth herein. Rather, this embodiment is provided so that the disclosure will be thorough and complete and will fully convey the scope of the disclosure to those skilled in the art. Accordingly, an embodiment described herein should be understood to include various modifications, equivalents, and/or alternatives.

In addition, techniques that are well known in the art and not directly related to the present disclosure are not described herein. This is to clearly convey the subject matter of the present disclosure by omitting an unnecessary explanation. Also, the terms are merely used for describing a particular embodiment but do not limit the embodiment. Singular forms are intended to include plural forms unless the context clearly indicates otherwise.

[Pellicle for Extreme Ultraviolet Lithography]

FIG. 1 is a cross-sectional view showing a pellicle for extreme ultraviolet lithography using directly grown multilayer graphene according to the present disclosure.

Referring to FIG. 1, a pellicle 100 for extreme ultraviolet lithography according to the present disclosure (hereinafter referred to as 'pellicle') includes a silicon nitride substrate 10, a core layer 20, and a capping layer 30. The silicon nitride substrate 10 has an opening 15 formed in a center portion. The core layer 20 and the capping layer 30 are formed on the silicon nitride substrate 10 so as to cover the opening 15.

The pellicle 100 is a consumable component that protects a mask from contaminants in a lithography process for semiconductor or display manufacturing. That is, the pellicle 100 is a thin film overlying the mask and serves as a cover. Because the light transferred to the wafer is focused with the mask in a lithographic exposure, even if contaminants exist on the pellicle 100 that is separated by a certain distance, it is possible to minimize a problem of forming a defective pattern due to out of focus.

As such, the pellicle 100 may minimize defective patterns while protecting the mask from contaminants during the exposure process, thereby greatly increasing the yield of semiconductor or display manufacturing. In addition, the use of the pellicle 100 can increase the lifespan of the mask.

Now, the pellicle 100 according to the present disclosure will be described in detail.

The silicon nitride substrate 10 supports the core layer 20 and the capping layer 30 and makes it easy to handle and transport the pellicle 100 during and after the process of manufacturing the pellicle 100. The silicon nitride substrate 10 may be formed of a material available for an etching process.

The silicon nitride substrate 10 includes a silicon substrate 11 and a support layer 13 made of a silicon nitride material and formed on the silicon substrate 11. The core layer 20 is formed on the support layer 13. The material of the support layer 13 may be represented by $SiN_x$. For example, the support layer 13 may be formed of $Si_3N_4$.

The opening 15 in the central portion of the silicon nitride substrate 10 may be formed using a micro-machining technique such as micro-electro mechanical systems (MEMS). That is, the opening 15 is formed by removing the central portion of the silicon substrate 11 under the support layer 13 by means of the micro-machining technique. The opening 15 partially exposes the support layer 13 under the core layer 20.

The core layer 20 is a layer that determines the transmittance of extreme ultraviolet rays, and is formed of multilayer graphene. The core layer 20 has a transmittance of 90% or more for extreme ultraviolet rays, and effectively dissipates heat to prevent overheating. The core layer 20 may have a thickness greater than the sum of the thicknesses of the support layer 13 and the capping layer 30.

The multilayer graphene forming the core layer 20 is formed by direct growth through interlayer exchange by heat exchange on the basis of few-layer graphene formed on the support layer 13. The direct growth method of multilayer graphene according to the present disclosure will be described in the manufacturing method of the pellicle 100.

The capping layer 30 provides thermal stability, mechanical stability, and chemical durability to the core layer 20 while minimizing a decrease in the transmittance of the core layer 20 for extreme ultraviolet rays. Specifically, the capping layer 30 is a protective layer for the core layer 20 and provides thermal stability by effectively dissipating heat generated in the core layer 20 to the outside. In addition, the capping layer 30 provides mechanical stability by supplementing the mechanical strength of the core layer 20. In addition, the capping layer 30 provides chemical durability by protecting the core layer 20 from hydrogen radicals and oxidation.

The capping layer 30 may include $SiN_x$, BN, $ZrB_x$ (2≤x<16), $ZrB_xSi_y$ (x≥2, y≥2), Si—BN, or Zr. The capping layer 30 may be formed by a chemical vapor deposition (CVD) process, but is formed by an atomic layer deposition (ALD) process or an ion beam sputtering deposition (IBSD) process, so that the best transmittance and minimized defects can be realized through free control of thickness, physical properties, and chemical composition. The capping layer 30 may be formed on the core layer 20 to have a thickness of 1 nm to 5 nm. Preferably, the capping layer 30 is formed with a thickness of 3 nm to 4 nm on the core layer 20.

[Method for Manufacturing a Pellicle for Extreme Ultraviolet Lithography Using a Multilayer Graphene Direct Growth Method]

Figure 2:
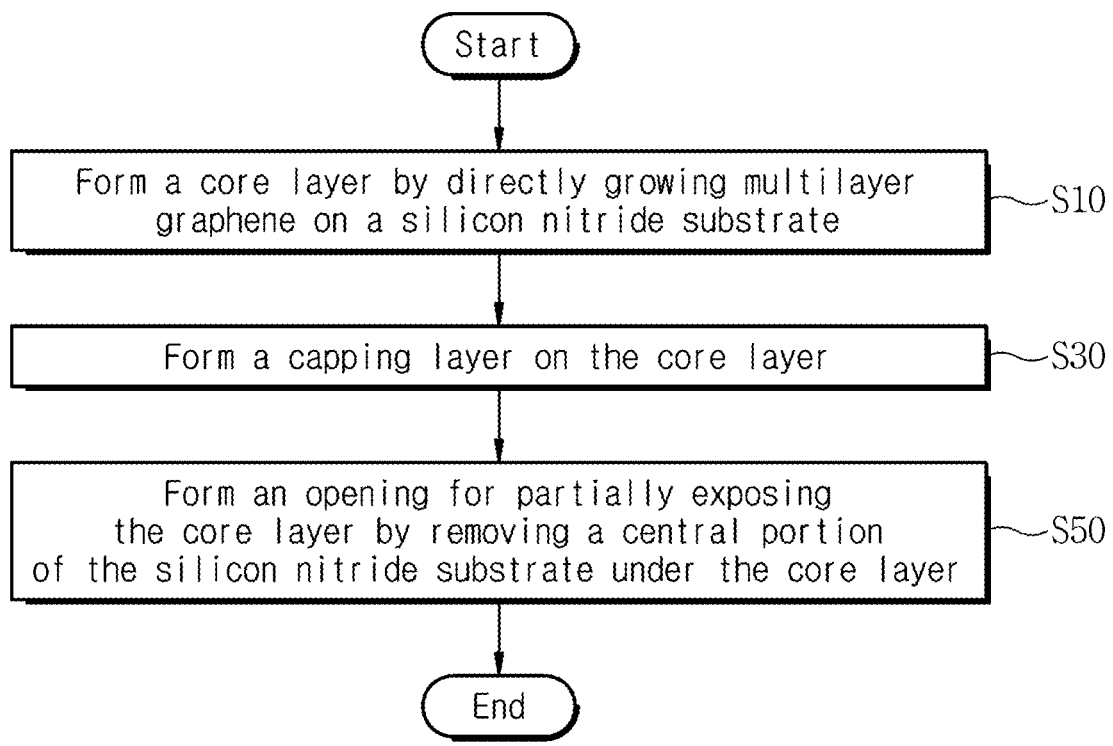
FIG. 2 is a flowchart showing a method of manufacturing a pellicle for extreme ultraviolet lithography using a direct growth method of multilayer graphene according to the present disclosure.
Figure 3:
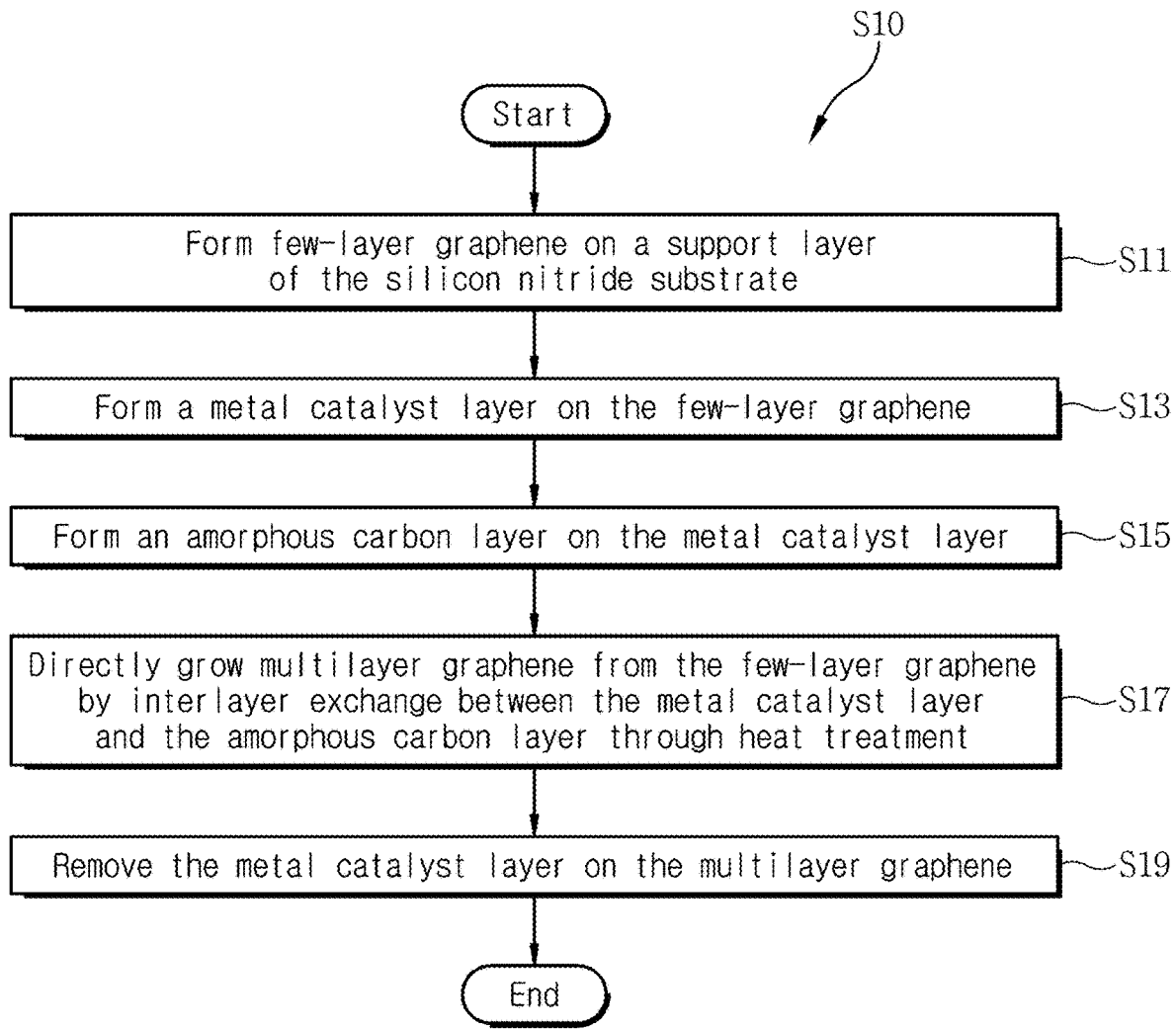
FIG. 3 is a detailed flowchart showing the step of forming the core layer of FIG. 2.

Hereinafter, a method for manufacturing the pellicle 100 according to the present disclosure will be described with reference to FIGS. 2 and 3. FIG. 2 is a flowchart showing a method of manufacturing a pellicle for extreme ultraviolet lithography using a direct growth method of multilayer graphene according to the present disclosure. FIG. 3 is a detailed flowchart showing the step of forming the core layer of FIG. 2.

The method for manufacturing a pellicle according to the present disclosure includes a step S10 of forming a core layer by directly growing multilayer graphene on a silicon nitride substrate, a step S30 of forming a capping layer on the core layer, and a step S50 of forming an opening for partially exposing the core layer by removing a central portion of the silicon nitride substrate under the core layer.

The step S10 of forming the core layer includes a step S11 of forming few-layer graphene on a support layer of the silicon nitride substrate, a step S13 of forming a metal catalyst layer on the few-layer graphene, a step S15 of forming an amorphous carbon layer on the metal catalyst layer, and a step S17 of directly growing multilayer graphene from the few-layer graphene by interlayer exchange between the metal catalyst layer and the amorphous carbon layer through heat treatment. Then, after the step S17 of directly growing the multilayer graphene, a step S19 of removing the metal catalyst layer on the multilayer graphene is performed.

Hereinafter, the above respective steps of the method for manufacturing a pellicle according to the present disclosure will be described with reference to FIGS. 2 to 9. FIGS. 4 to 9 are views showing respective steps in the manufacturing method shown in FIG. 2. FIGS. 5 to 8 are enlarged views of part 'A' of FIG. 4.

As shown in FIGS. 4 to 7, at the step S10, the core layer 20 is formed on the silicon nitride substrate 10 through a direct growth of multilayer graphene 23.

Figure 4:
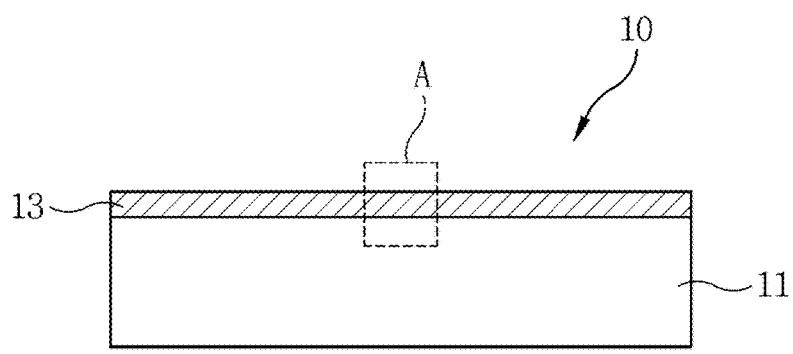
FIGS. 4 to 9 are views showing respective steps in the manufacturing method shown in FIG. 2.

First, as shown in FIG. 4, the silicon nitride substrate 10 is prepared. The silicon nitride substrate 10 is composed of the silicon substrate 11 and the support layer 13 formed on the silicon substrate 11. The support layer 13 is made of a silicon nitride material such as $Si_3N_4$.

Figure 5:
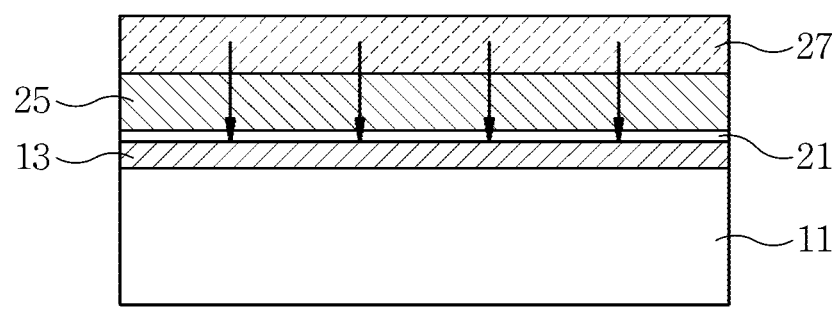

Next, as shown in FIG. 5, few-layer graphene 21, a metal catalyst layer 25, and an amorphous carbon layer 27 are sequentially stacked on the support layer 13 of the silicon nitride substrate 10 at the steps S11 to S15.

Specifically, at the step S11, the few-layer graphene 21 is formed on the support layer 13. The few-layer graphene 21 is graphene with five or less layers. The few-layer graphene 21 is a seed layer of the multilayer graphene, and is a diffusion barrier that prevents metal of the metal catalyst layer 25 from diffusing into the silicon nitride substrate 10.

The few-layer graphene 21 may be formed on the support layer 13 by means of transferring technique. That is, after growing the few-layer graphene 21 on a nickel thin film or a copper thin film by the CVD process, the grown few-layer graphene 21 may be transferred onto the support layer 13.

In addition, at the step S13, the metal catalyst layer 25 is formed on the few-layer graphene 21. The material of the metal catalyst layer 25 may include Ni, Co, Ru, or Pt.

The metal catalyst layer 25 is formed to have a thickness of 10 nm to 100 nm by a sputtering process or an e-beam evaporation process.

In addition, at the step S15, the amorphous carbon layer 27 is formed on the metal catalyst layer 25. That is, the amorphous carbon layer 27 is formed to have a thickness of 10 nm to 100 nm by the sputtering process.

Figure 6:
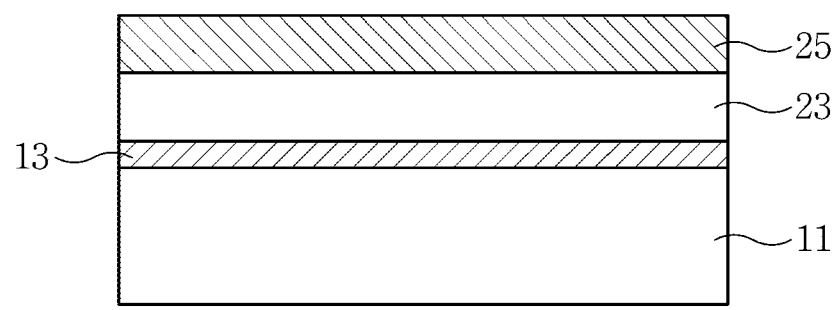

Next, as shown in FIG. 6, the multilayer graphene 23 is directly grown from the few-layer graphene (21 in FIG. 5) at the step S17 by interlayer exchange between the metal catalyst layer 25 and the amorphous carbon layer 27 through heat treatment.

As such, when heat treatment is performed using the few-layer graphene 21 formed on the support layer 13 of the silicon nitride substrate 10 as a seed layer, the multilayer graphene 23 is directly grown on the silicon nitride substrate 10 by means of the interlayer exchange principle. That is, when the metal catalyst layer 25 and the amorphous carbon layer 27 are sequentially formed on the few-layer graphene 21 and then subjected to heat treatment, carbon in the amorphous carbon layer 27 is moved to the few-layer graphene 21 by the interlayer exchange principle to directly grow the multilayer graphene 23.

Thermodynamically, a driving force of the interlayer exchange is because the Gibbs free energy is lowered when the amorphous carbon becomes a crystalline state. Therefore, if the few-layer graphene 21 acting as a seed layer is placed under the metal catalyst layer 25, the interlayer exchanges can occur wholly and smoothly even if the heat treatment is performed at a temperature lower than a conventional heat treatment temperature for growing the multilayer graphene. The heat treatment according to the present disclosure may be performed at 500 to 1100° C. for 10 minutes to 10 hours in a hydrogen gas and inert gas atmosphere. The inert gas may include at least one of nitrogen, argon, and helium.

Because the multilayer graphene 23 can be directly grown on the support layer 13 of the silicon nitride substrate 10 as described above, the manufacturing process of the multilayer graphene 23 can be simplified in manufacturing the pellicle.

In addition, because the few-layer graphene 21 functions as a diffusion barrier that prevents metal of the metal catalyst layer 25 from diffusing into the silicon nitride substrate 10 during the heat treatment process, the quality of the multilayer graphene 23 directly grown on the silicon nitride substrate 10 can be improved.

Figure 7:
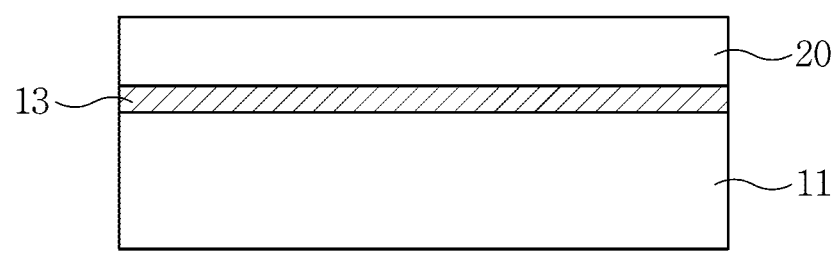

Next, as shown in FIG. 7, at the step S19, the metal catalyst layer (25 in FIG. 6) on the multilayer graphene (23 in FIG. 6) is removed, so that the core layer 20 formed of multilayer graphene is obtained. The metal catalyst layer 25 on the multilayer graphene 23 may be removed through selective etching of the metal catalyst layer 25.

Figure 8:
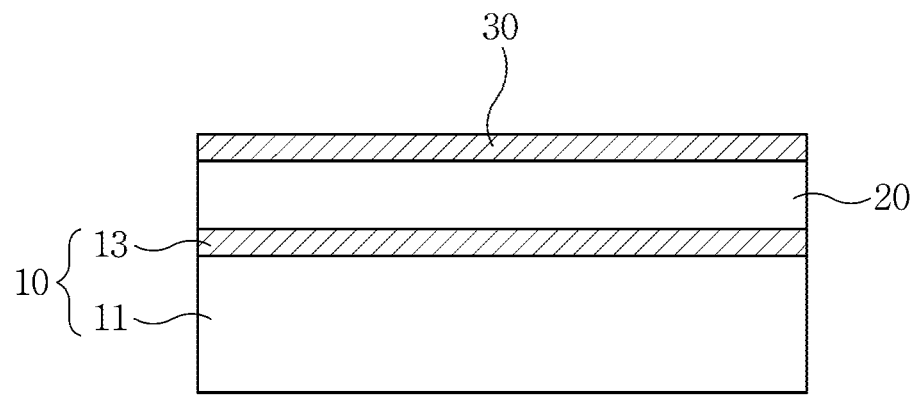

Subsequently, as shown in FIG. 8, the capping layer 30 is formed on the core layer 20 at the step S30. The capping layer 30 is formed with a thickness of 1 nm to 5 nm on the core layer 20 by the ALD or IBSD process. The capping layer 30 may include $SiN_x$, BN, $ZrB_x$ (2≤x<16), $ZrB_xSi_y$ (x≥2, y≥2), Si—BN, or Zr.

Figure 9:
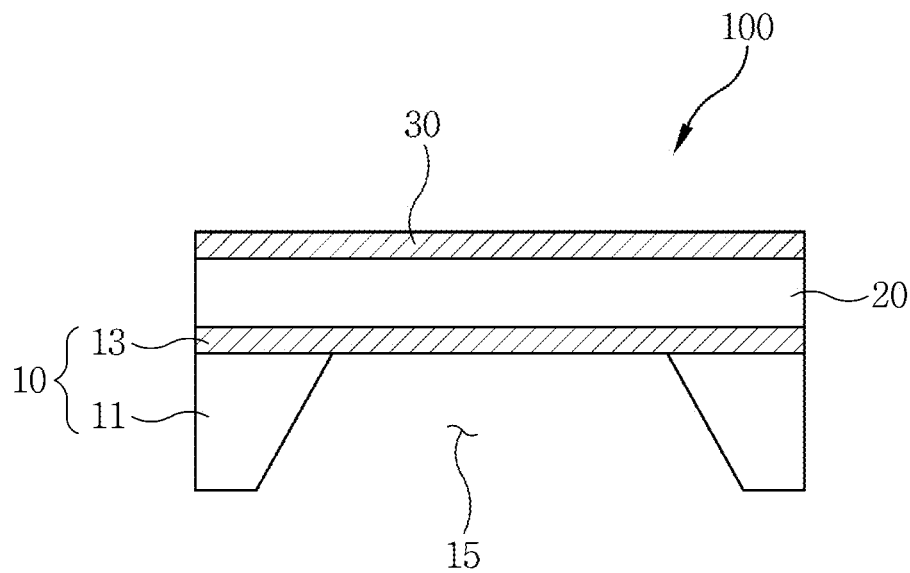

In addition, as shown in FIG. 9, the opening 15 through which the core layer 20 is partially exposed is formed at the step S50 by removing the central portion of the silicon nitride substrate 10 under the core layer 20. As a result, the pellicle 100 according to the present disclosure is obtained. To form the opening 15, the central portion of the silicon substrate 11 under the support layer 13 is removed through a wet etching process. The opening 15 partially exposes the support layer 13 under the core layer 20.

The pellicle 100 manufactured by the above-described manufacturing method of the present disclosure includes the multilayer graphene 23 as the core layer 20, so it can provide thermal stability, mechanical stability, and chemical durability while having a high extreme ultraviolet transmittance of 90% or more.

In addition, even if the multilayer graphene 23 manufactured by the above-described manufacturing method of the present disclosure is employed as the core layer 20, and the support layer 13 and the capping layer 30 of several nanometers are formed on both sides of the core layer 20, it is possible to provide an extreme ultraviolet transmittance of 90% or more and a maximum reflectance of 0.0005%.

In addition, by forming the capping layer 30 in the ALD or IBSD process, it is possible to realize the best transmittance and minimized defects through free control of thickness, physical properties, and chemical composition.

Embodiments

In order to check the transmittance and reflectance of the pellicle according to the present disclosure in an extreme ultraviolet output environment of 350 W or more, a pellicle according to an embodiment was manufactured using the manufacturing method according to the present disclosure, and transmittance and reflectance were measured.

The pellicle according to the embodiment has a structure in which a silicon nitride layer (support layer) of $Si_3N_4$, a core layer of multilayer graphene, and a capping layer of Si₃N₄ are formed on a silicon substrate. The pellicle according to the embodiment is denoted by Si$_3$N$_4$_C_Si$_3$N$_4$.

Figure 10:
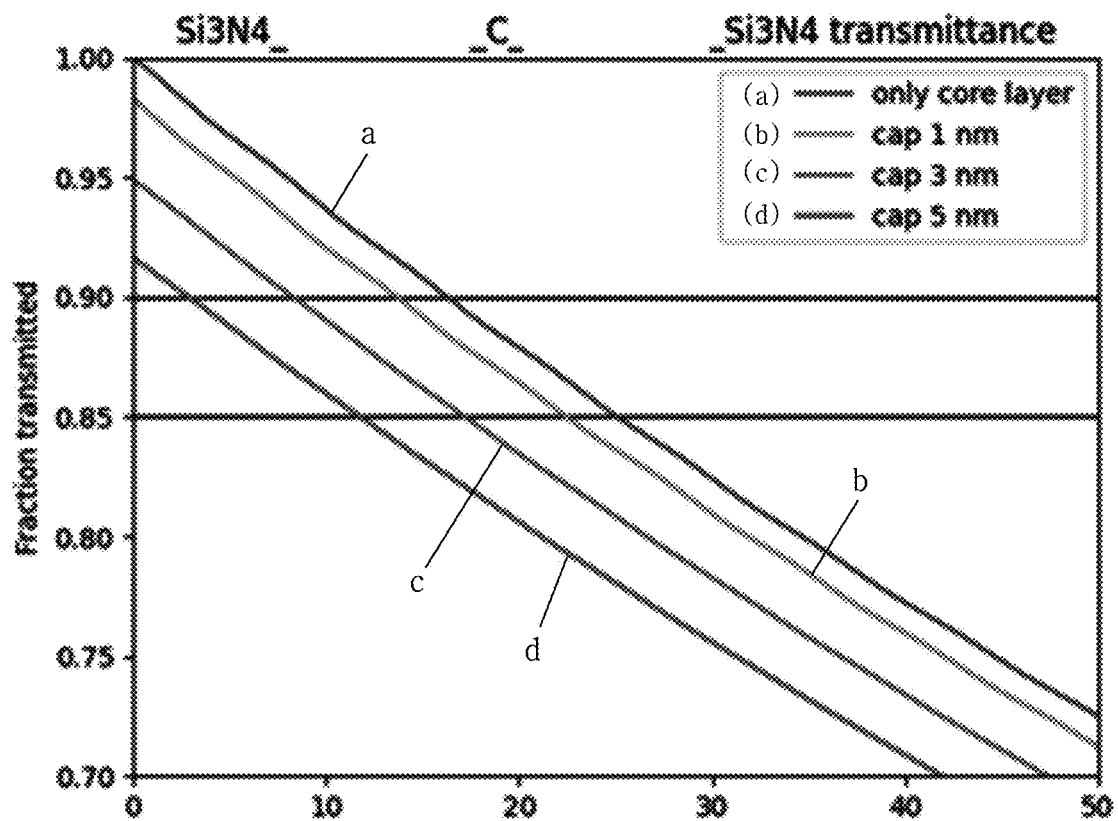
FIG. 10 is a graph showing the extreme ultraviolet transmittance of a pellicle according to an embodiment.
Figure 11:
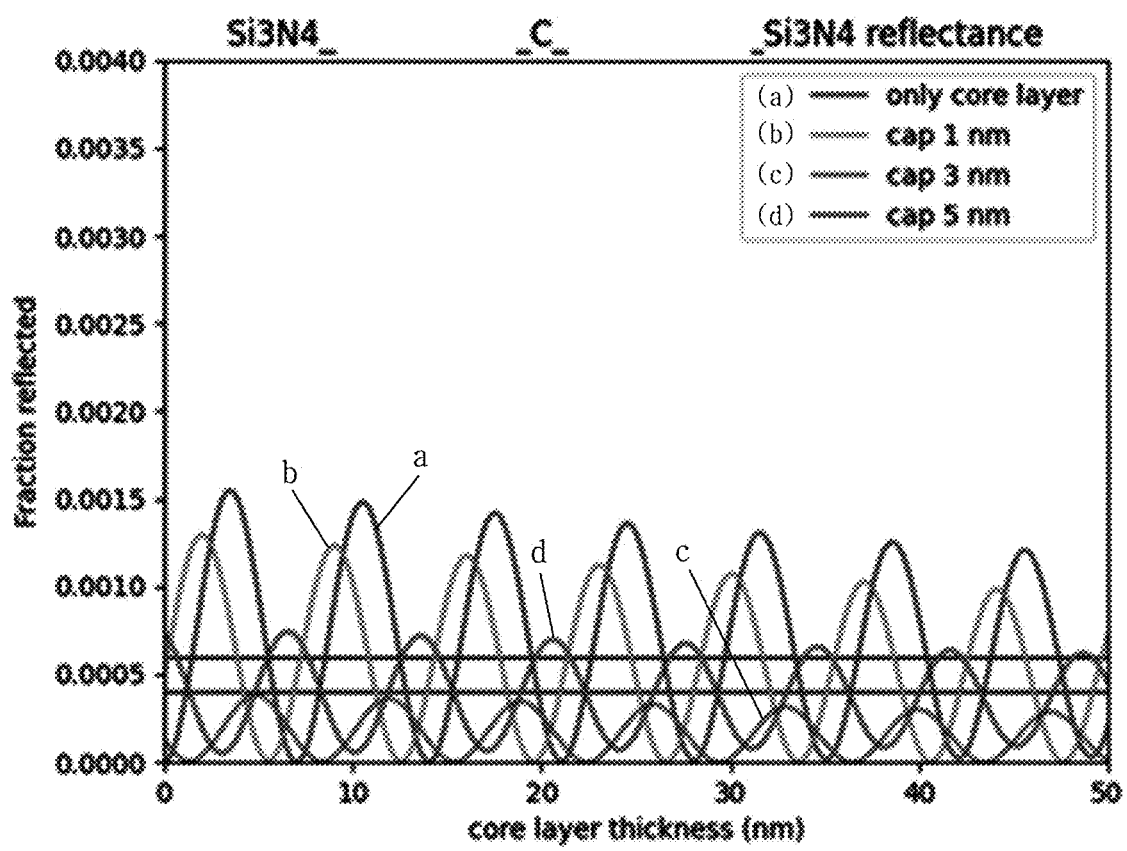
FIG. 11 is a graph showing the extreme ultraviolet reflectance of a pellicle according to an embodiment.
Figure 12:
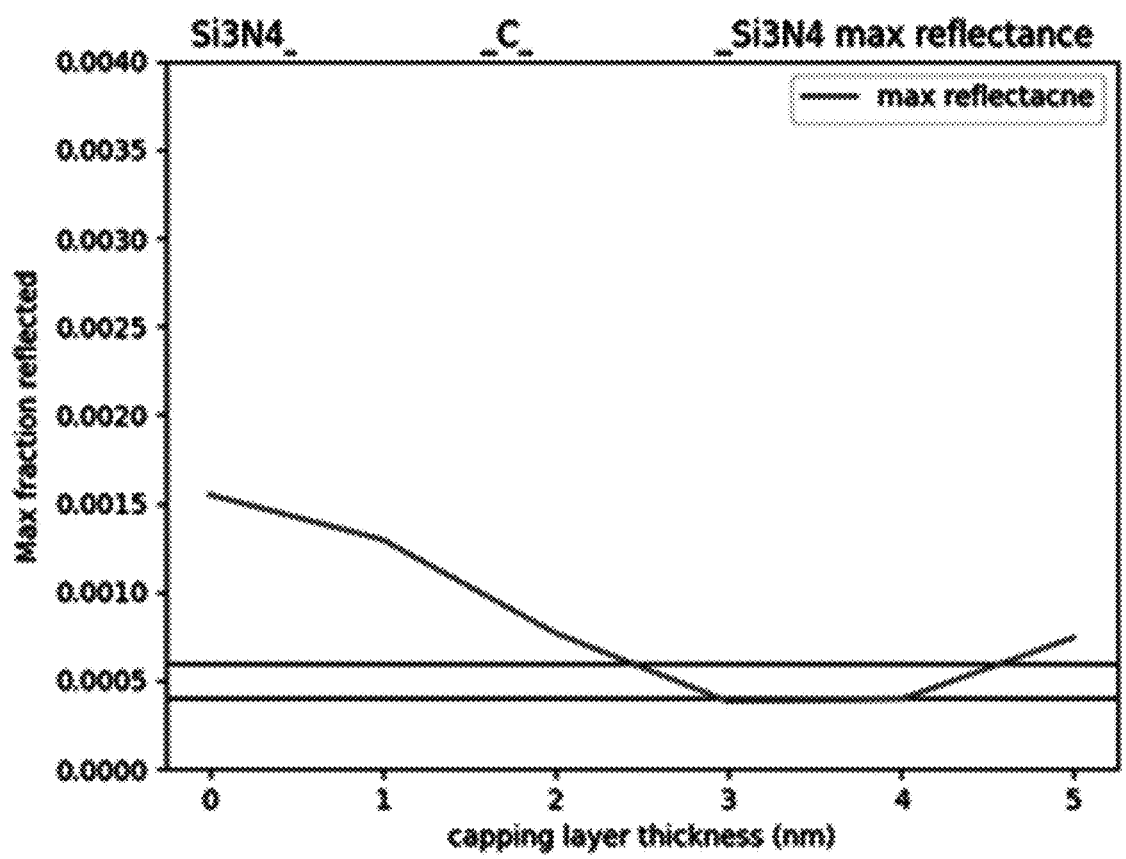
FIG. 12 is a graph showing the maximum extreme ultraviolet reflectance of a pellicle according to an embodiment.

FIG. 10 is a graph showing the extreme ultraviolet transmittance of a pellicle according to an embodiment. FIG. 11 is a graph showing the extreme ultraviolet reflectance of a pellicle according to an embodiment. FIG. 12 is a graph showing the maximum extreme ultraviolet reflectance of a pellicle according to an embodiment.

While the thickness of the capping layer was adjusted to 0 nm, 1 nm, 3 nm, and 5 nm, the transmittance and reflectance of the pellicle according to the embodiment were simulated in an extreme ultraviolet output environment of 350 W.

Referring to FIG. 10, it can be seen that the transmittance of the pellicle according to the embodiment decreases as the thickness of the capping layer increases.

For example, when the pellicle according to the embodiment has an extreme ultraviolet transmittance of 90% or more, the thickness of the core layer is as follows.

First, when the capping layer has a thickness of 0 nm, that is, when there is only the core layer without the capping layer, the thickness of the core layer is 16.4 nm or less.

When the capping layer has a thickness of 1 nm, the thickness of the core layer is 14 nm or less.

When the capping layer has a thickness of 3 nm, the thickness of the core layer is 8.6 nm or less.

In addition, when the capping layer has a thickness of 5 nm, the thickness of the core layer is 2.9 nm or less.

Therefore, the capping layer is formed to have a thickness of 3 nm to 4 nm so that the pellicle according to the embodiment has an extreme ultraviolet transmittance of 90% or more.

As shown in FIG. 11, the reflectance of the pellicle according to the embodiment is 0.0015% or less when the capping layer is formed to have a thickness of 1 to 5 nm and the core layer is formed to have a thickness of 50 nm or less.

As shown in FIG. 12, the thickness of the capping layer for controlling the maximum reflectance of the pellicle according to the embodiment to be 0.0005% or less is between 2 nm and 5 nm. In this case, the thickness of the core layer is irrelevant.

Therefore, in order for the pellicle according to the embodiment to have an extreme ultraviolet transmittance of 90% or more and a maximum reflectance of 0.0005% or less, the capping layer is formed to have a thickness of 3 nm to 4 nm.

As shown in FIGS. 13 to 16, in order to check whether multilayer graphene is formed under the metal catalyst layer with respect to the multilayer graphene prepared by the manufacturing method of the present disclosure, analysis was performed with a Raman spectrometer. Here, single-layer graphene was used as the few-layer graphene, and nickel was used as the metal catalyst layer.

Figure 13:
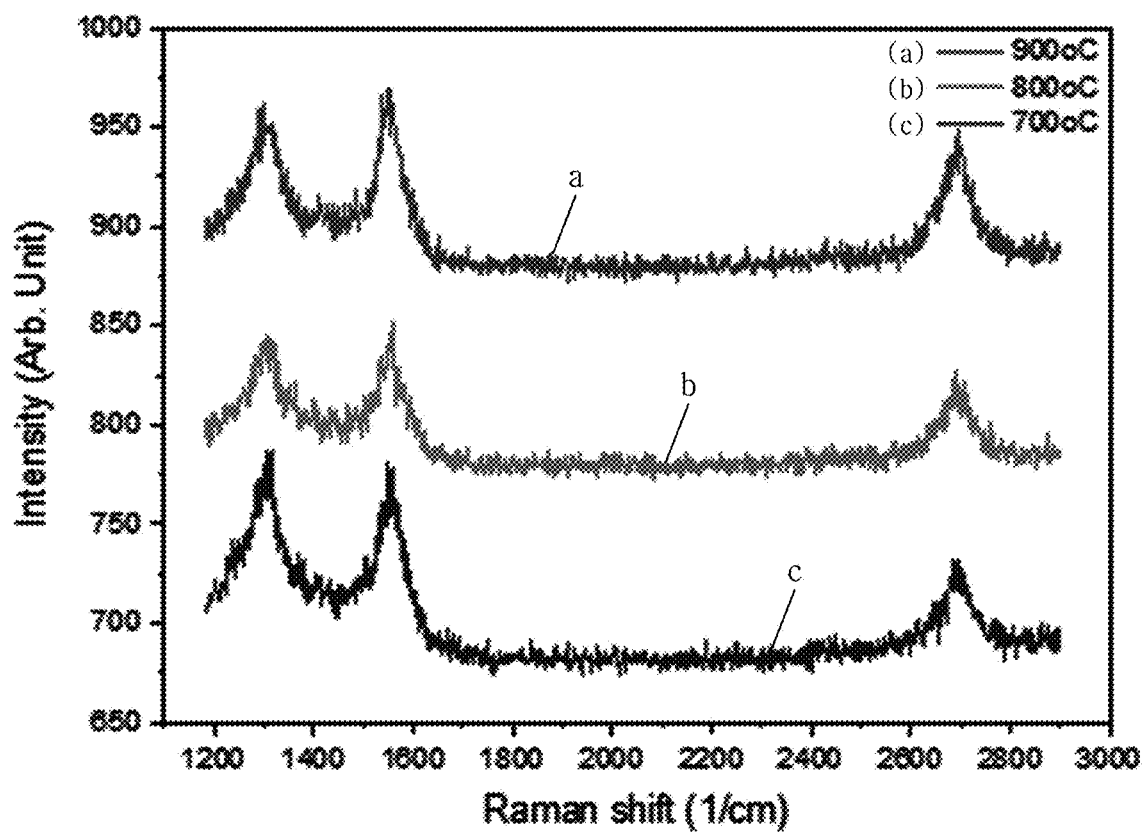
FIGS. 13 and 14 are graphs showing analysis results of Raman spectroscopy for each heat treatment temperature of multilayer graphene according to an embodiment.
Figure 14:
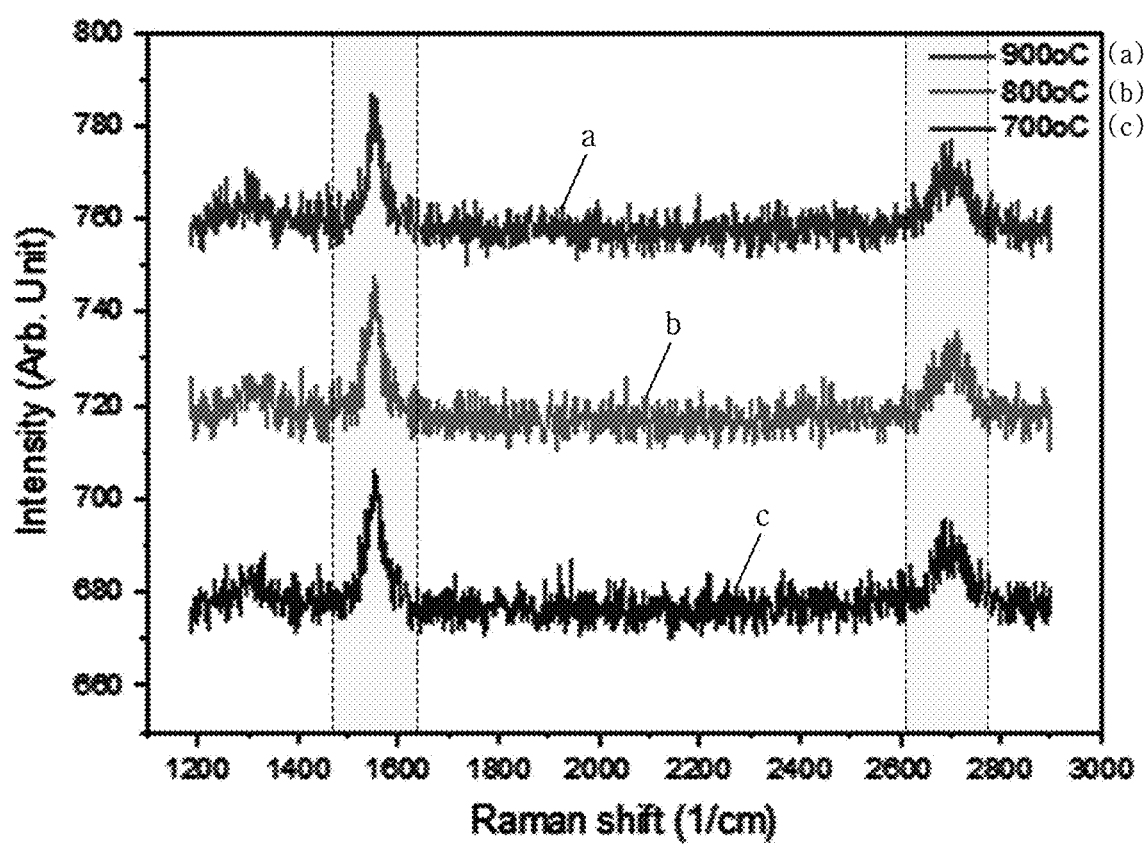

FIGS. 13 and 14 are graphs showing analysis results of Raman spectroscopy for each heat treatment temperature of multilayer graphene according to an embodiment. FIG. 13 shows an analysis result of Raman spectroscopy for each heat treatment temperature of multilayer graphene as viewed from the metal catalyst layer. FIG. 14 shows an analysis result of Raman spectroscopy for each heat treatment temperature of multilayer graphene as viewed from the silicon nitride layer. Heat treatment was carried out at 700° C., 800° C., and 900° C. The thickness of the amorphous carbon layer is 30 nm.

From FIGS. 13 and 14, it can be seen that multilayer graphene is grown under the metal catalyst layer.

Figure 15:
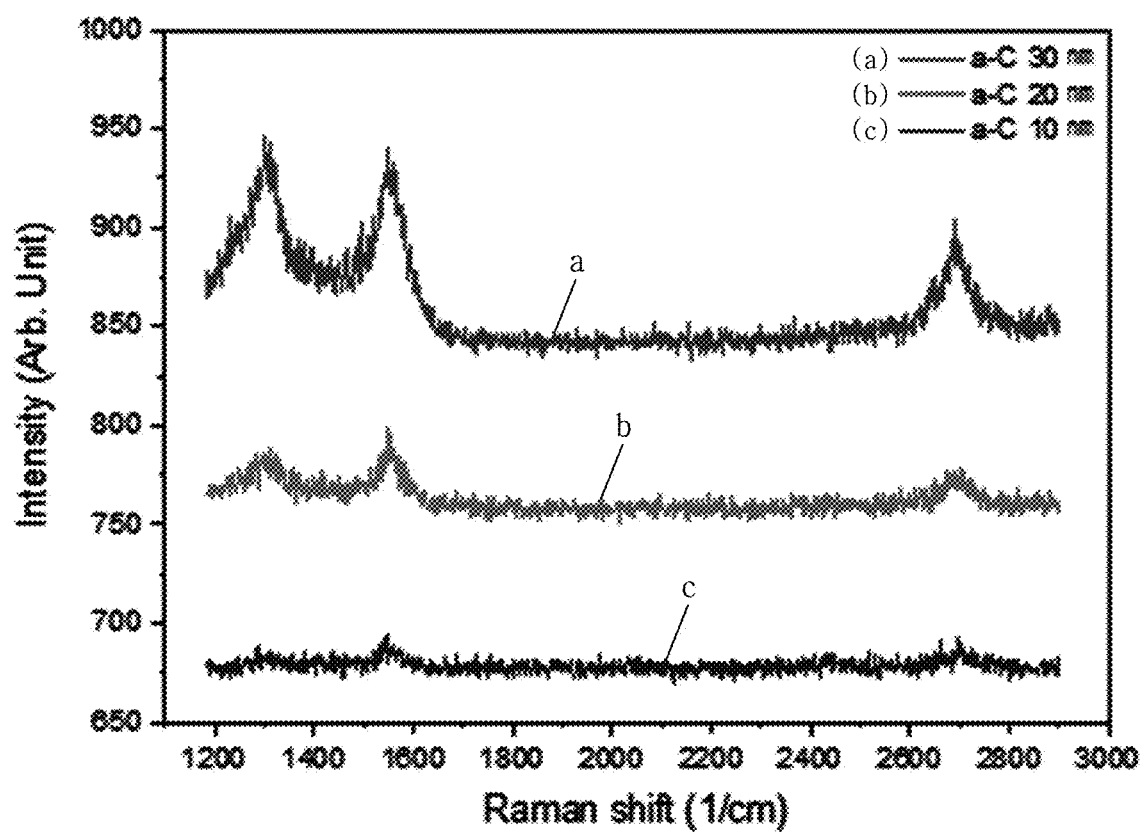
FIGS. 15 and 16 are graphs showing analysis results of Raman spectroscopy for each thickness of an amorphous carbon layer forming multilayer graphene according to an embodiment.
Figure 16:
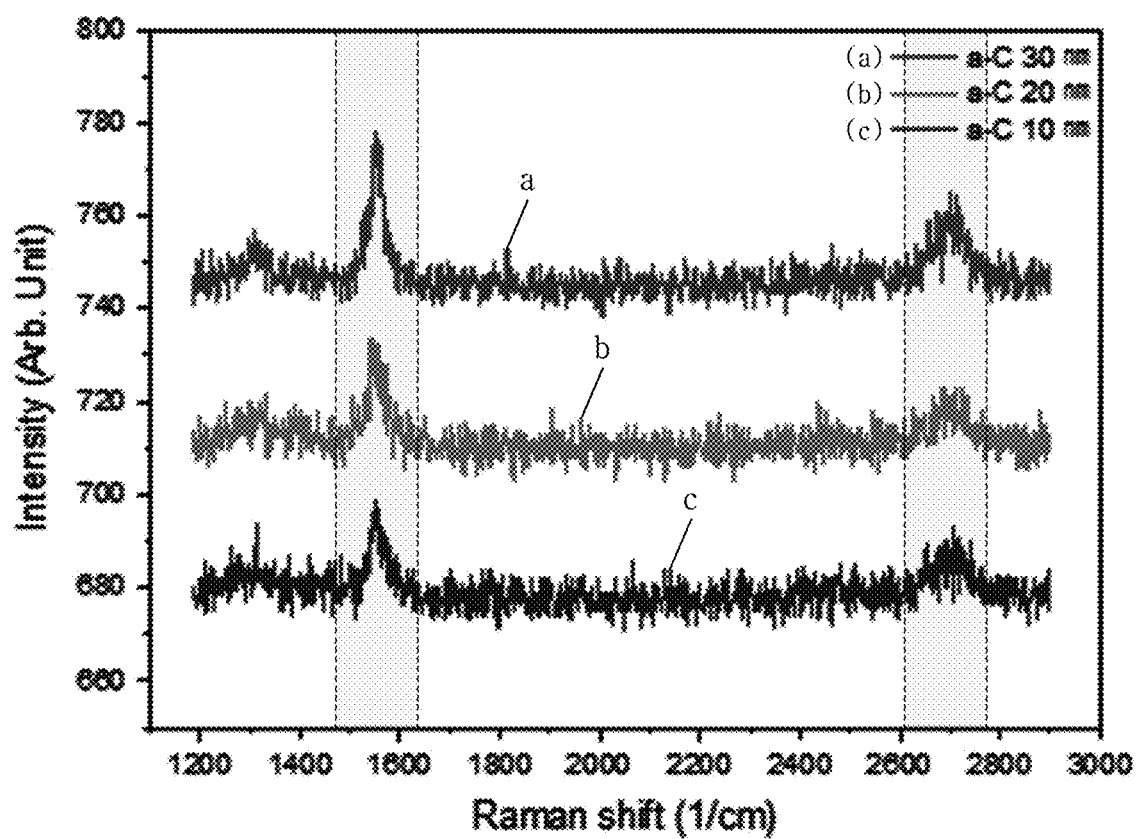

FIGS. 15 and 16 are graphs showing analysis results of Raman spectroscopy for each thickness of an amorphous carbon layer forming multilayer graphene according to an embodiment. FIG. 15 shows an analysis result of Raman spectroscopy for each amorphous carbon layer thickness of multilayer graphene as viewed from the metal catalyst layer. FIG. 16 shows an analysis result of Raman spectroscopy for each amorphous carbon layer thickness of the multilayer graphene as viewed from the silicon nitride layer. Heat treatment was performed at 700° C. The thickness of the amorphous carbon layer was changed to 10 nm, 20 nm, and 30 nm.

From FIGS. 15 and 16, it can be seen that multilayer graphene is grown under the metal catalyst layer.

While the present disclosure has been particularly shown and described with reference to an exemplary embodiment thereof, it will be understood by those skilled in the art that various changes in form and details may be made therein without departing from the scope of the present disclosure as defined by the appended claims.

What is claimed is:

1. A method for direct growth of multilayer graphene of a pellicle for extreme ultraviolet lithography, the pellicle comprising a silicon containing substrate and the multilayer graphene formed on the silicon containing substrate, the method comprising:
    forming a graphene seed layer on the silicon containing substrate;
    forming a metal catalyst layer on the graphene seed layer;
    forming an amorphous carbon layer on the metal catalyst layer; and
    directly growing the multilayer graphene from the graphene seed layer by interlayer exchange between the metal catalyst layer and the amorphous carbon layer through heat treatment, wherein carbon in the amorphous carbon layer passes through the metal catalyst layer and is moved to the graphene seed layer.

2. The method of claim 1, wherein the silicon containing substrate includes a silicon substrate layer and a support layer comprising a silicon nitride material and formed on the silicon substrate layer, and
    wherein the graphene seed layer is formed on the support layer.

3. The method of claim 1, wherein the graphene seed layer comprises one or more and five or less graphene layers.

4. The method of claim 1, wherein the graphene seed layer is formed on the silicon containing substrate by growing the graphene seed layer on a nickel thin film or a copper thin film and transferring the graphene seed layer onto the silicon containing substrate.

5. The method of claim 1, wherein the graphene seed layer is configured to prevent metal of the metal catalyst layer from diffusing into the silicon containing substrate.

6. The method of claim 1, wherein the metal catalyst layer includes Ni, Co, Ru, or Pt.

7. The method of claim 1, wherein the metal catalyst layer is formed to have a thickness of 10 nm to 100 nm by a sputtering process or an e-beam evaporation process.

8. The method of claim 1, wherein the amorphous carbon layer is formed to have a thickness of 10 nm to 100 nm by a sputtering process.

9. The method of claim 1, wherein the heat treatment is performed at 500° C. to 1100° C. for 10 minutes to 10 hours in a hydrogen gas and inert gas atmosphere, and the inert gas includes at least one of argon or helium.

10. The method of claim 1, further comprising:
after directly growing the multilayer graphene, removing the metal catalyst layer on the multilayer graphene.

11. A method for manufacturing a pellicle for extreme ultraviolet lithography by using a direct growth of multilayer graphene, the method comprising:
forming a graphene seed layer on a silicon containing substrate;
forming a metal catalyst layer on the graphene seed layer;
forming an amorphous carbon layer on the metal catalyst layer;
directly growing the multilayer graphene from the graphene seed layer by interlayer exchange between the metal catalyst layer and the amorphous carbon layer through heat treatment, wherein carbon in the amorphous carbon layer passes through the metal catalyst layer and is moved to the graphene seed layer; and
removing the metal catalyst layer to obtain a core layer comprising the multilayer graphene;
forming a capping layer on the core layer; and
forming an opening in a central portion of the silicon containing substrate under the core layer to partially expose the silicon containing substrate.

12. The method of claim 11, wherein the silicon containing substrate includes a silicon substrate layer and a support layer comprising a silicon nitride material and formed on the silicon substrate layer,
wherein the graphene seed layer is formed on the support layer, and
wherein the opening is formed by removing a central portion of the silicon substrate layer under the support layer to partially expose the support layer.

13. The method of claim 12, wherein the graphene seed layer comprises one or more and five or less graphene layers, and is configured to prevent metal of the metal catalyst layer from diffusing into the silicon containing substrate.

14. The method of claim 11, wherein the capping layer includes $SiN_x$, BN, $ZrB_x$ ($2 \leq x < 16$), $ZrB_xSi_y$ ($x \geq 2$, $y \geq 2$), Si—BN, or Zr.

15. The method of claim 11, wherein the capping layer has a thickness of 1 nm to 5 nm and is formed by an atomic layer deposition (ALD) process or an ion beam sputtering deposition (IBSD) process.

* * * * *